US00RE40725E

(19) United States
(12) Reissued Patent
Tamura et al.

(10) Patent Number: US RE40,725 E
(45) Date of Reissued Patent: Jun. 9, 2009

(54) MAGNETIC BODY FORMED BY QUANTUM DOT ARRAY USING NON-MAGNETIC SEMICONDUCTOR

(75) Inventors: Hiroyuki Tamura, Sagamihara (JP); Kenji Shiraishi, Isehara (JP); Hideaki Takayanagi, Sagamihara (JP)

(73) Assignee: Nippon Telegraph and Telephone Corporation (JP)

(21) Appl. No.: 11/584,794

(22) Filed: Oct. 20, 2006

Related U.S. Patent Documents

Reissue of:
(64) Patent No.: 6,489,041
Issued: Dec. 3, 2002
Appl. No.: 09/732,807
Filed: Dec. 8, 2000

(30) Foreign Application Priority Data

Dec. 9, 1999 (JP) ..... 11-350297

(51) Int. Cl.
*H01L 43/08* (2006.01)
*H01L 29/82* (2006.01)

(52) U.S. Cl. ..... 428/620; 428/641; 257/12; 257/14; 257/15; 257/16; 257/17; 257/183; 438/962

(58) Field of Classification Search ..... None
See application file for complete search history.

(56) References Cited

U.S. PATENT DOCUMENTS 5,294,807 A * 3/1994 Ugajin et al. ..... 257/14
5,747,180 A * 5/1998 Miller et al. ..... 428/601
6,333,516 B1 * 12/2001 Katoh et al. ..... 257/22
6,424,004 B2 * 7/2002 Kim et al. ..... 257/321

FOREIGN PATENT DOCUMENTS

DK WO 01/00522 A2 * 1/2001
JP 09-116169 * 5/1997
JP 2001-257394 * 9/2001
WO 01/00522 * 1/2001

* cited by examiner

*Primary Examiner*—Jennifer McNeil
*Assistant Examiner*—Jason L Savage
(74) *Attorney, Agent, or Firm*—Kilpatrick Stockton LLP

(57) ABSTRACT

A practically realizable semiconductor magnetic body having a flat-band structure is disclosed. The semiconductor magnetic body is formed by semiconductor quantum dots arranged on lattice points such that electrons can transfer between neighboring quantum dots and the electron energy band contains a flat-band structure, where each quantum dot is a structure in which electrons are confined inside a region which is surrounded by high energy potential regions, and the flat-band structure is a band structure in which energy dispersion of electrons has hardly any wave number dependency.

25 Claims, 9 Drawing Sheets

(a)

(b)

MAGNETIC BODY FORMED BY QUANTUM DOT ARRAY USING NON-MAGNETIC SEMICONDUCTOR

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a magnetic body using non-magnetic semiconductor.

2. Description of the Background Art

Conventionally known magnetic materials for forming magnetic bodies include natural magnets such as magnetite ($Fe_3O_4$), alloy steel magnets such as chrome steel and high cobalt steel, and magnets containing alnico, ferrite, or rare earth elements.

Conventionally, circuits such as magnetic memory media and magnetic sensors have been manufactured using these magnetic materials. However, it has been necessary to manufacture these circuits separately from electronic parts on LSI substrate such as transistors because of the various problems related to the manufacturing process including the fact that these magnetic materials all contain metals which have poor affinity with materials such as silicon and GaAs used for LSI substrate, and this has been an obstacle for realization of compact and densely integrated electronic circuits.

On the other hand, there has been theoretical propositions to manufacture magnetic bodies using a flat-band structure. Here, the flat-band structure refers to a band structure in which energy dispersion of electrons has hardly any wave number dependency.

In general, in the case of filling electrons into degenerate energy levels, there arises an effect to align spins parallel as much as possible in order to gain the exchange energy. A typical example of this effect is the so called Hund's first law in the atomic nucleus model.

The fact that the effect to align spins parallel as much as possible arises in the case of filling electrons into a dispersionless (i.e., strongly degenerate) system such as the flat-band structure has been predicted by Lieb, Mielke, and Tasaki by using a mathematical model assuming the short distance Coulomb interaction such as Hubbard model. (See: E. Lieb, "Two Theorems on the Hubbard Model", Physical Review Letters, Vol. 62, No. 10, pp. 1201–1204, March 1989; A. Mielke, "Ferromagnetism in the Hubbard model on line graphs and further considerations", J. Phys. A: Match. Gen. 24, pp3311–3321, 1991; and H. Tasaki, "Ferromagnetism in the Hubbard Models with Degenerate Single-Electron Ground States", Physical Review Letters, Vol. 69, No. 10, pp. 1608–1611, September 1992.)

However, their propositions are based on many approximations such as the assumption of the short distance Coulomb interaction that are used in solving the mathematical model, and whether the flat-band ferromagnetic states predicted by using such mathematical models can be actually realized or not cannot be judged correctly without carrying out accurate calculations in accordance with the real materials.

Based on these propositions of Lieb, Mielke and Tasaki, there have been theoretical propositions to manufacture magnetic bodies using non-metal material such as Graphite, Ga atoms and As atoms. (See: N. Shima, et al., "Electronic Structure of Superhoneycomb Systems: A Peculiar Realization of Semimetal/Semiconductor Classes and Ferromagnetism, Physical Review Letters, Vol. 71, No. 26, pp.4389–4392, December 1993; and R. Arita, et al., "Ferromagnetism in a Hubbard model for an atomic quantum wire: A realization of flat-band magnetism from even-membered rings", Physical Review B, Vo. 57, No. 12, pp. R6854–6857, March 1998, for example.)

However, it has been practically difficult to artificially synthesize materials that realize the flat-band or arrange small atoms exactly as designed, so that it has been impossible to manufacture the flat-band magnetic bodies in practice.

Thus the conventional magnetic bodies made of metal elements have no affinity with the semiconductor LSI process, so that it has been impossible to manufacture them on the same substrate.

It has also been impossible to form a material having a flat-band structure that exhibits ferromagnetism by using non-magnetic materials, due to difficulties in synthesizing or manufacturing such a material.

Also, some conventional magnetic bodies contain harmful materials such as manganese and chromium, and there are great concern about their adverse effects on human bodies and environment, and they are also a factor for increasing the recycle cost.

SUMMARY OF THE INVENTION

It is therefore an object of the present invention to provide a practically realizable semiconductor magnetic body having a flat-band structure, by forming quantum dot array using the semiconductor manufacturing and growth techniques.

According to one aspect of the present invention there is provided a semiconductor magnetic body, comprising: semiconductor quantum dots arranged on lattice points such that electrons can transfer between neighboring quantum dots and the electron energy band contains a flat-band structure, where each quantum dot is a structure in which electrons are confined inside a region which is surrounded by high energy potential regions, and the flat-band structure is a band structure in which energy dispersion of electrons has hardly any wave number dependency.

Other features and advantages of the present invention will become apparent from the following description taken in conjunction with the accompanying drawings.

DETAILED DESCRIPTION OF THE PREFERRED EMBODIMENTS

Referring now to FIG. 1 to FIG. 12, the preferred embodiments of the magnetic body according to the present invention will be described in detail.

First, the theoretical principles underlying the magnetic body of the present invention will be described.

The energy band of electrons in the case of arranging quantum dots on a two-dimensional plane can be calculated as follows. Here, a "quantum dot" refers to a structure in which electrons are confined inside a region which is surrounded by high energy potential regions.

Now consider the following Hamiltonian:

$$H = -\frac{\hbar^2}{2m^*}\Delta + \sum_i v(r - R_i) \tag{1}$$

where m* is an effective mass of an electron, V(r) is a confining potential of an individual dot, and $R_i$ is a position of a dot.

Here it is assumed that the Schrödinger equation for an isolated dot has a non-degenerate eigenvalue that satisfies the following equation.

$$Ha\phi(r) = \left(-\frac{\hbar^2}{2m^*}\Delta + v(r)\right)\phi(r) = \varepsilon\phi(r) \tag{2}$$

Figure 9:
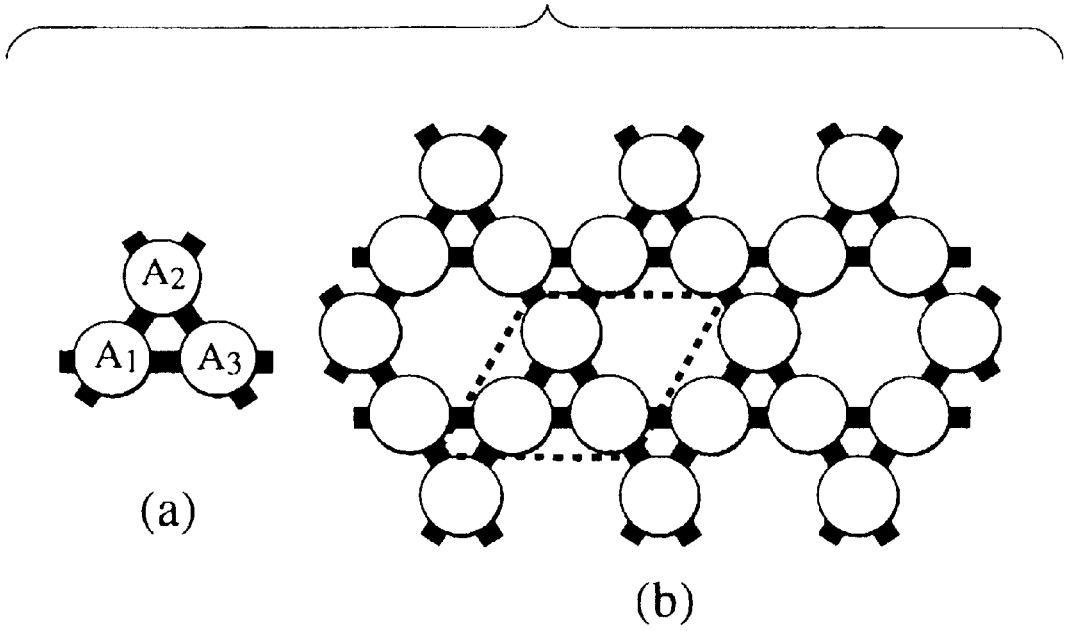
FIG. 9 is a diagram showing a configuration of a magnetic body according to the ninth embodiment of the present invention.

In the following, a Lieb model as shown in parts (a) and (b) of FIG. 1, a polymer model as shown in parts (a) and (b) of FIG. 2, and a reticulated double triangle pattern (Kagome) model as shown in FIG. 9.

Assuming that electrons are localized near dots and still can transfer between neighboring dots, the system can be described well by the tight-binding model.

In the tight-binding model, the Bloch states are given by the following equation.

$$\Phi_{\alpha,k}(r) = -\frac{1}{\sqrt{N_\alpha}}\sum_i e^{ik\cdot R_i}\phi(r - r_\alpha - R_i) \tag{3}$$

where $r_\alpha$ is positions of dots within a unit cell ($\alpha$=1, 2, 3), and $N_\alpha$ is the number of dots.

The eigenstates with respect to the Hamiltonian (1) can be expressed as follows.

$$\Psi_k(r) = \sum_n c_n\Phi_{n,k}(r) \tag{4}$$

In the case of taking only the nearest transfer and the overlap integrals into account, the following eigenvalue equations (6), (7) and (8) can be obtained for the Lieb model, the polymer model, and the reticulated double triangle pattern (Kagome) model, respectively.

$$\begin{pmatrix} \varepsilon & t(1+e^{-2ik_xa}) & t(1+e^{-2ik_ya}) \\ t(1+e^{2ik_xa}) & \varepsilon & 0 \\ t(1+e^{2ik_ya}) & 0 & \varepsilon \end{pmatrix} c = E\begin{pmatrix} 1 & s(1+e^{-2ik_xa}) & s(1+e^{-2ik_ya}) \\ s(1+e^{2ik_xa}) & 1 & 0 \\ s(1+e^{2ik_ya}) & 0 & \varepsilon \end{pmatrix} c \tag{6}$$

$$\begin{pmatrix} \varepsilon + 2t\cos(ka) & t & t \\ t & \varepsilon & 0 \\ t & 0 & \varepsilon \end{pmatrix} c = E\begin{pmatrix} 1 + 2s\cos(ka) & s & s \\ s & 1 & 0 \\ s & 0 & 1 \end{pmatrix} c \tag{7}$$

$$\begin{pmatrix} \varepsilon & t(1+e^{-ik_xa}) & t(1+e^{-ik_ya}) \\ t(1+e^{k_xa}) & \varepsilon & t(1+e^{i(k_x-k_y)a}) \\ t(1+e^{ik_ya}) & t(1+e^{-i(k_x-k_y)a}) & \varepsilon \end{pmatrix} c = E\begin{pmatrix} 1 & s(1+e^{-ik_xa}) & s(1+e^{-ik_ya}) \\ s(1+e^{k_xa}) & 1 & s(1+e^{i(k_x-k_y)a}) \\ s(1+e^{ik_ya}) & s(1+e^{-i(k_x-k_y)a}) & 1 \end{pmatrix} c \tag{8}$$

where the transfer integral is given by $t=\int dr\phi(r)H\phi(r+a)$, the overlap integral is given by $s=\int dr\phi(r)\phi(r+a)$, a=(a, 0) and $c=(c_1, c_2, c_3)$.

This tight-binding model calculation properly accounts for the overlap integral between the nearest neighbors which is often neglected.

The equations (6), (7) and (8) can be readily solved, to yield the eigenvalues for the Lieb model, the polymer mode, and the reticulated double triangle pattern (Kagome) model are given by the following equations (9), (10) and (11).

$$E = \varepsilon,\ \varepsilon - (t - \varepsilon s)\frac{2\sqrt{\cos^2(k_xa) + \cos^2(k_ya)}}{1 \pm 2s\sqrt{\cos^2(k_xa) + \cos^2(k_ya)}} \tag{9}$$

$$E = \varepsilon,\ \varepsilon - \frac{2(\varepsilon s - t)}{2s - \cos(ka) \pm \sqrt{2 + \cos^2(ka)}} \tag{10}$$

$$E = \varepsilon - 2t,\ \varepsilon - t\left(-1 \pm \sqrt{3 + 2\cos(k_xa) + 2\cos(k_xa - k_ya)}\right) \tag{11}$$

Figure 10A:
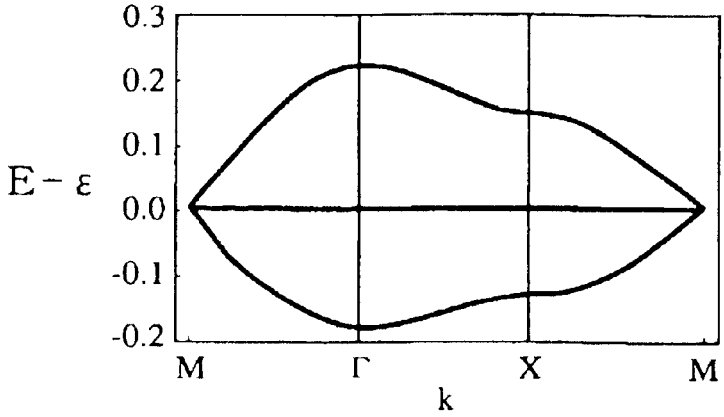
FIGS. 10A, 10B and 10C are examplary band diagrams for a Lieb model of FIG. 1, a polymer model of FIG. 2, and a reticulated double triangle pattern (Kagome) model of FIG. 9.
Figure 10B:
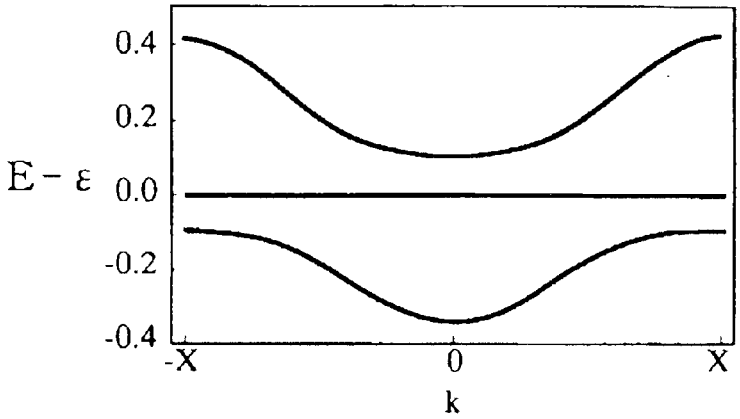
Figure 10C:
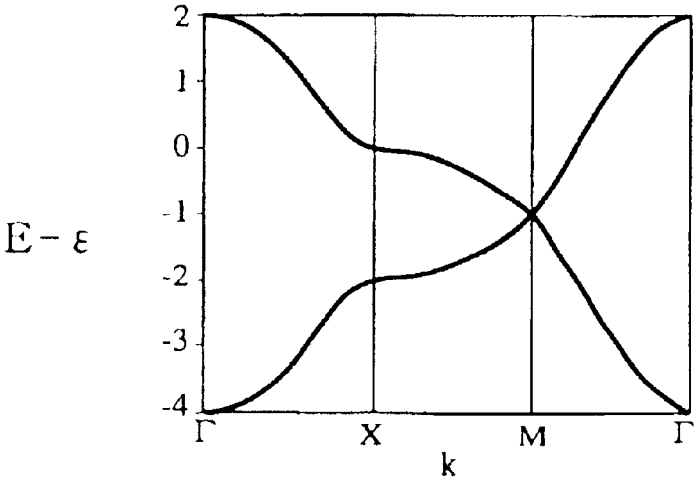

FIGS. 10A, 10B and 10C depict the band diagrams of the equations (9), (10) and (11) respectively. It can be seen that the flat-band with the energy $\epsilon$ is formed in the cases of the equations (9) and (10) as indicated by straight lines at $E=\epsilon$ in FIGS. 10A and 10B, and the dispersionless flat-band with the energy $\epsilon-2t$ which is independent of the wave numbers $k_x$ and $k_y$ is formed in the case of the equation (11) as indicated by a straight line at $E-\epsilon=2$ in FIG. 10C where it is assumed that $t=-1$ for simplicity.

According to Lieb, Mielke, and Tasaki, the effect to align spins parallel as much as possible arises in the case of filling electrons into a dispersionless (i.e., strongly degenerate) system such as the flat-band structure, so that the ferromagnetic state can be exhibited by using a material having the flat-band structure.

Now, the present invention provides a specific practically realizable form of such a material having a flat-band structure, in a form of a semiconductor magnetic body having a flat-band structure which is formed by a semiconductor quantum dot array, that can be manufactured by using the available semiconductor manufacturing technique and growth technique.

More specifically, the magnetic body according to the present invention is formed by arranging semiconductor quantum dots on lattice points such that electrons can transfer between neighboring quantum dots and the electron energy band contains a flat-band structure, where the quantum dot is a structure in which electrons are confined inside a region which is surrounded by high energy potential regions, and a flat-band structure is a band structure in which energy dispersion of electrons has hardly any wave number dependency.

Figure 1:
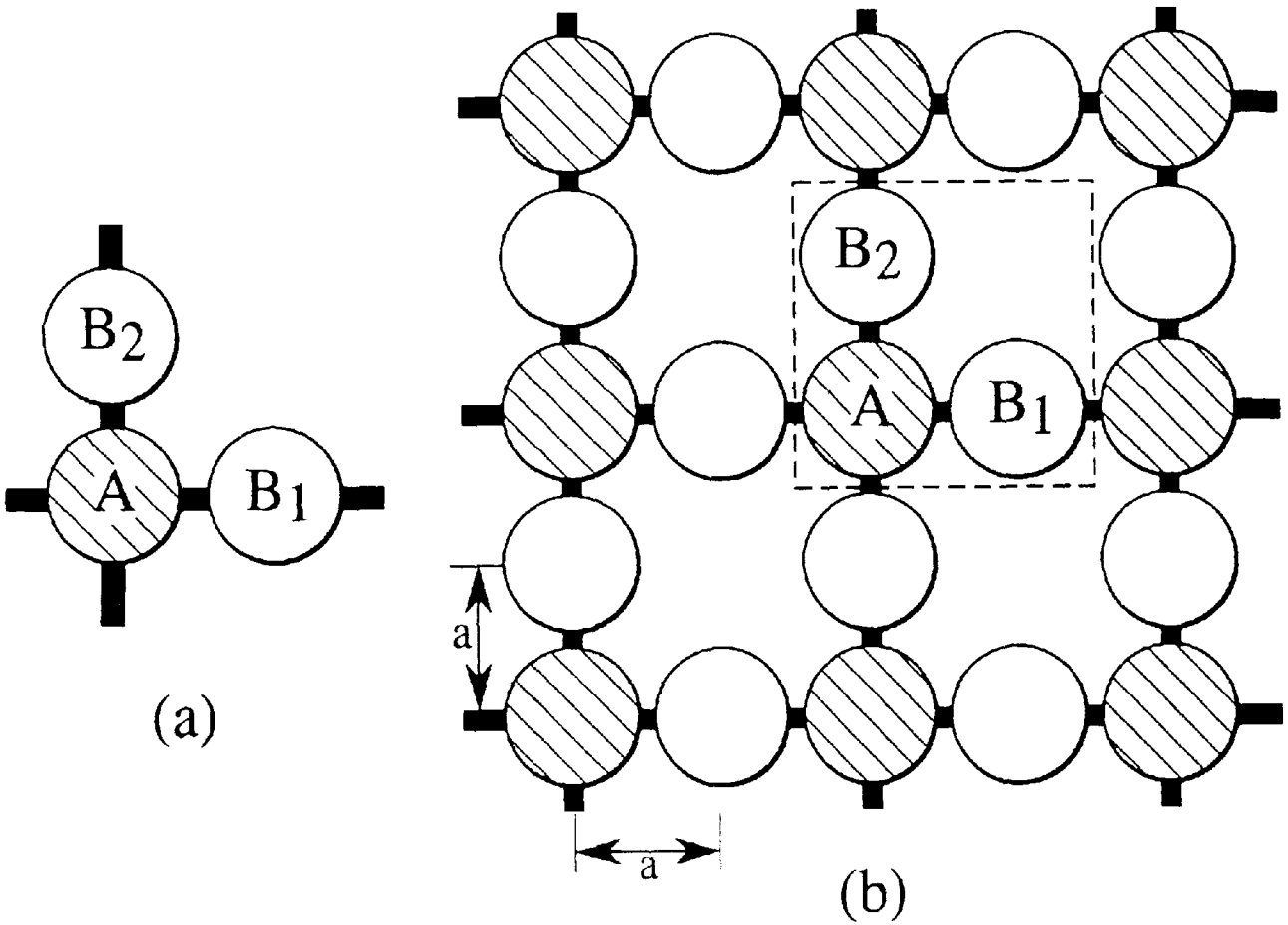
FIG. 1 is a diagram showing a configuration of a magnetic body according to the first embodiment of the present invention.

FIG. 1 shows a first embodiment of the magnetic body according to the present invention, which is formed by arranging first quantum dots A (indicated by hatched circles) on first lattice points located at intersections or rectangular lattices, and arranging second quantum dots $B_1$ and $B_2$ (indicated by blank circles) on second lattice points located at midpoints between intersections of the rectangular lattices, such that the electrons can transfer between the neighboring quantum dots A and $B_1$ ($B_2$).

In further detail, as shown in a part (a) of FIG. 1, one unit is formed by arranging one first quantum dot A and two second quantum dots $B_1$ and $B_2$ two dimensionally, such that one second quantum dot $B_1$ is arranged on a right side of the first quantum dot A while another second quantum dot $B_2$ is arranged on an upper side of the first quantum dot A.

Namely, the first quantum dot A has four branches of directions into which the electrons can transfer, and each of the second quantum dots $B_1$ and $B_2$ has two branches of directions into which the electrons can transfer. Then, these first and second quantum dots are connected in such a way that upper and right branches of the first quantum dot A are connected with a left branch of the second quantum dot $B_1$ of the same unit and a lower branch of the second quantum dot $B_2$ of the same unit. Then, as shown in a part (b) of FIG. 1, neighboring units are connected in such a way that lower and left branches of the first quantum dot A of one unit are connected with a right branch of the second quantum dot of a left neighbor unit and an upper branch of the second quantum dot of a lower neighbor unit, while a right branch of the second quantum dot $B_1$ of one unit is connected with a left branch of the first quantum dot of a right neighbor unit and an upper branch of the second quantum dot $B_2$ of one unit is connected with a lower branch of the first quantum dot of an upper neighbor unit.

The magnetic body of the first embodiment can have an overall structure in which a plurality of the above described units are linked periodically as shown in FIG. 1.

Figure 2:
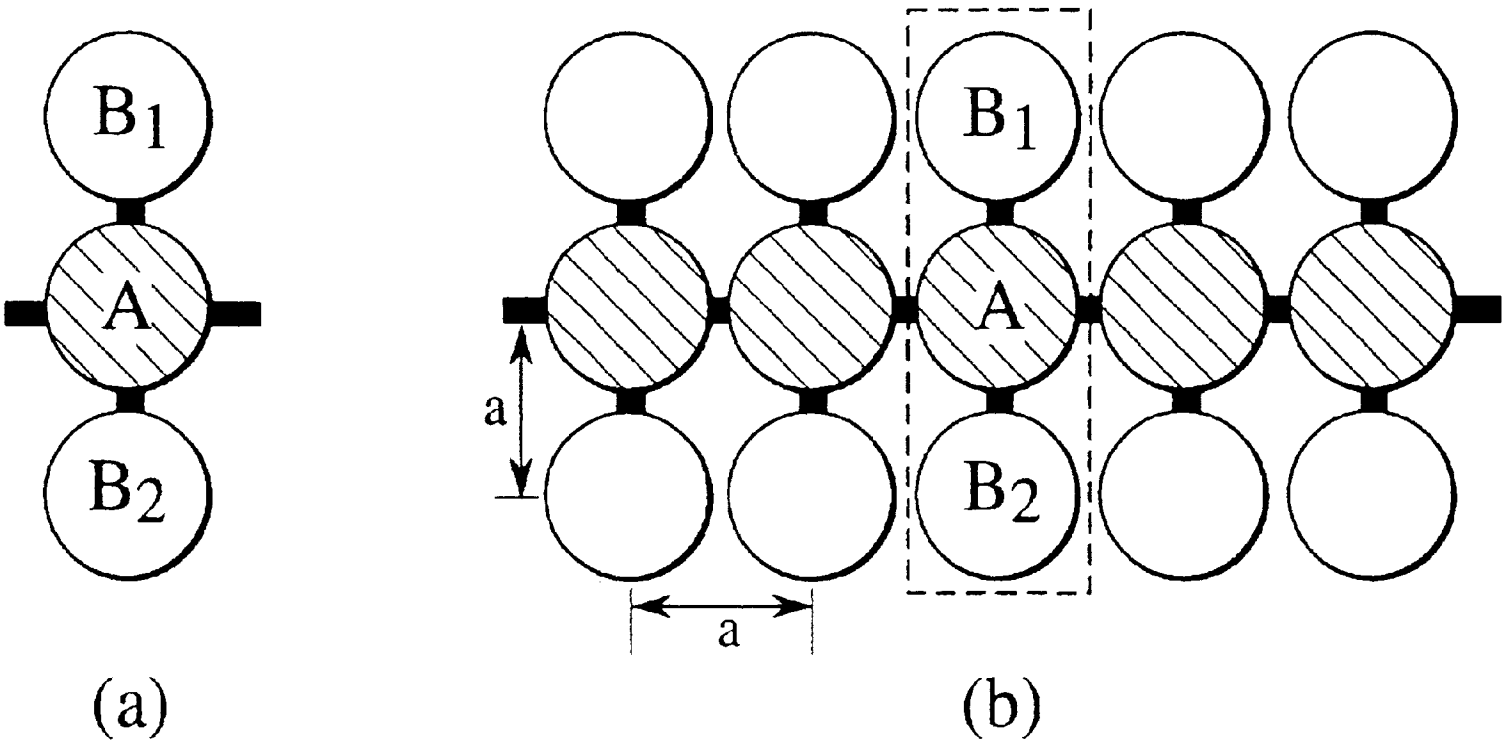
FIG. 2 is a diagram showing a configuration of a magnetic body according to the second embodiment of the present invention.

FIG. 2 shows a second embodiment of the magnetic body according to the present invention, which is formed by arranging first quantum dots A (indicated by hatched circles) on first lattice points located on a first linear lattice, and arranging second quantum dots $B_1$ and $B_2$ (indicated by blank circles) on second lattice points located at endpoints of a second linear lattice intersecting the first linear lattice perpendicularly, such that the electrons can transfer between the neighboring quantum dots A and $B_1$ ($B_2$).

In further detail, as shown in a part (a) of FIG. 1, one unit is formed by arranging one first quantum dot A and two second quantum dots $B_1$ and $B_2$ two dimensionally, such that one second quantum dot $B_1$ is arranged on an upper side of the first quantum dot A while another second quantum dot $B_2$ is arranged on a lower side of the first quantum dot A.

Namely, the first quantum dot A has four branches of directions into which the electrons can transfer, and each of the second quantum dots $B_1$ and $B_2$ has one branch of a direction into which the electrons can transfer. Then, these first and second quantum dots are connected in such a way that upper and lower branches of the first quantum dot A are connected with a lower branche of the second quantum dot $B_1$ of the same unit and an upper branch of the second quantum dot $B_2$ of the same unit. Then, as shown in a part (b) of FIG. 2, neighboring units are connected in such a way that a left branch of the first quantum dot A of one unit is connected with a right branch of the first quantum dot of a left neighbor unit while a right branch of the first quantum dot A of one unit is connected with a left branch of the first quantum dot of a right neighbor unit.

The magnetic body of the second embodiment can have an overall structure in which a plurality of the above described units are linked periodically as shown in FIG. 2.

Figure 3:
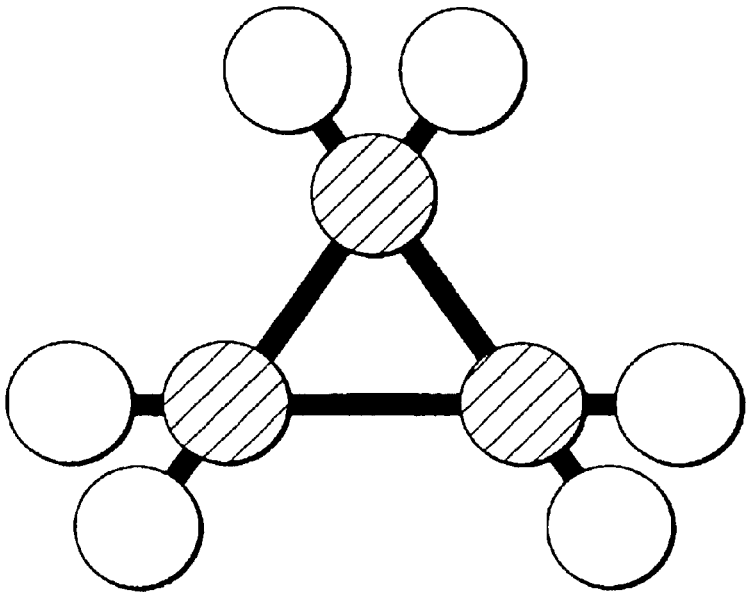
FIG. 3 is a diagram showing a configuration of a magnetic body according to the third embodiment of the present invention.

FIG. 3 shows a third embodiment of the magnetic body according to the present invention, which is formed by arranging first quantum dots (indicated by hatched circles) on first lattice points located at intersections of triangular lattices, and arranging second quantum dots (indicated by blank circles) on second lattice points located at endpoints of the triangular lattices, such that the electrons can transfer between the neighboring quantum dots.

In this case, one unit is formed by two dimensionally arranging one first quantum dot having four branches of directions into which the electrons can transfer, and two second quantum dots each having one branch of a direction into which the electrons can transfer. Then, these first and second quantum dots are two dimensionally connected in such a way that two branches of the first quantum dot are connected with one branch of one second quantum dot of the same unit and one branch of another second quantum dot of the same unit, while remaining two branches of the first quantum dot are connected with one branch of the first quantum dot of one neighbor unit and one branch of the first quantum dot of another neighbor unit.

The magnetic body of the third embodiment can have an overall structure in which a plurality of the above described units are linked in a ring shape as shown in FIG. 3.

Figure 4:
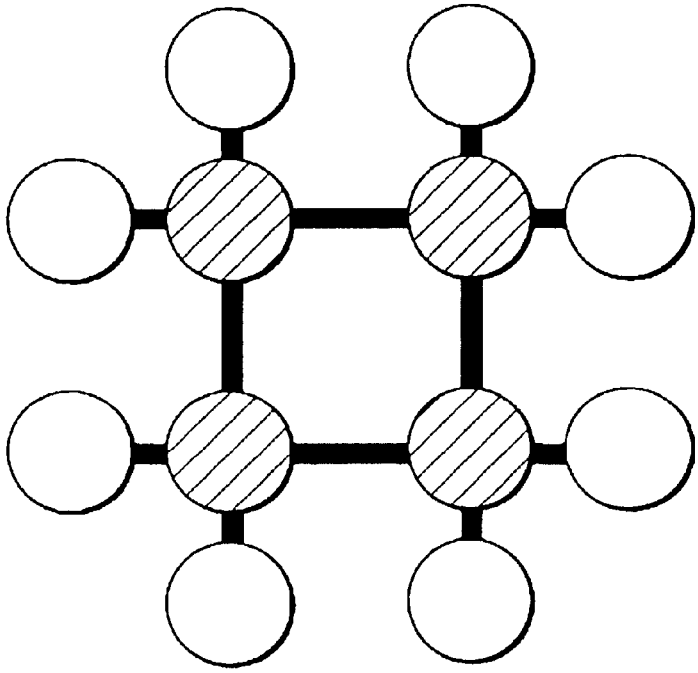
FIG. 4 is a diagram showing a configuration of a magnetic body according to the fourth embodiment of the present invention.

FIG. 4 shows a fourth embodiment of the magnetic body according to the present invention, which is formed by arranging first quantum dots (indicated by hatched circles) on first lattice points located at intersections of rectangular lattices, and arranging second quantum dots (indicated by blank circles) on second lattice points located at endpoints of the rectangular lattices, such that the electrons can transfer between the neighboring quantum dots.

In this case, one unit is formed by two dimensionally arranging one first quantum dot having four branches of directions into which the electrons can transfer, and two second quantum dots each having one branch of a direction into which the electrons can transfer. Then, these first and second quantum dots are two dimensionally connected in such a way that two branches of the first quantum dot are connected with one branch of one second quantum dot of the same unit and one branch of another second quantum dot of the same unit, while remaining two branches of the first quantum dot are connected with one branch of the first quantum dot of one neighbor unit and one branch of the first quantum dot of another neighbor unit.

The magnetic body of the fourth embodiment can have an overall structure in which a plurality of the above described units are linked in a ring shape as shown in FIG. 4.

Figure 5:
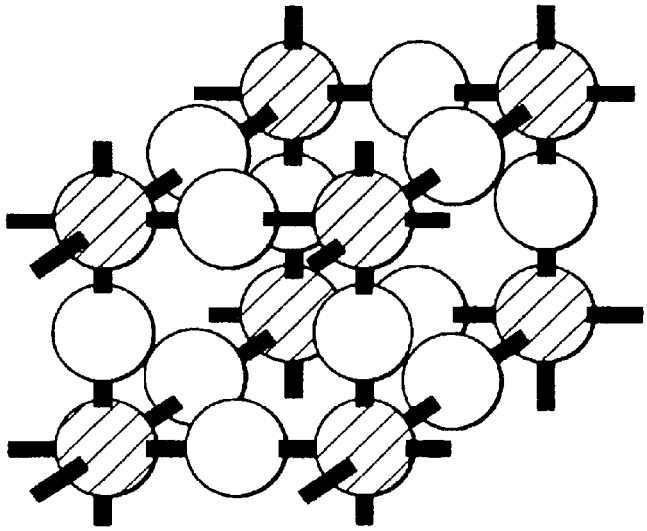
FIG. 5 is a diagram showing a configuration of a magnetic body according to the fifth embodiment of the present invention.

FIG. 5 shows a fifth embodiment of the magnetic body according to the present invention, which is formed by arranging first quantum dots (indicated by hatched circles) on first lattice points located at intersections of cubic lattices, and arranging second quantum dots (indicated by blank circles) on second lattice points located at midpoints between the intersections of the cubic lattices, such that the electrons can transfer between the neighboring quantum dots.

In this case, one unit is formed by three dimensionally arranging one first quantum dot having six branches of directions into which the electrons can transfer, and three second quantum dots each having two branches of directions into which the electrons can transfer. Then, these first and second quantum dots are three dimensionally connected in such a way that three branches of the first quantum dot are connected with one branch of one second quantum dot of the same unit, one branch of another second quantum dot of the same unit, and one branch of still another second quantum dot of the same unit, while remaining three branches of the first quantum dot are connected with one branch of the second quantum dot of one neighbor unit, one branch of the second quantum dot of another neighbor unit, and one branch of the second quantum dot of still another neighbor unit.

The magnetic body of the fifth embodiment can have an overall structure in which a plurality of the above described units are linked periodically as shown in FIG. 5.

Figure 6:
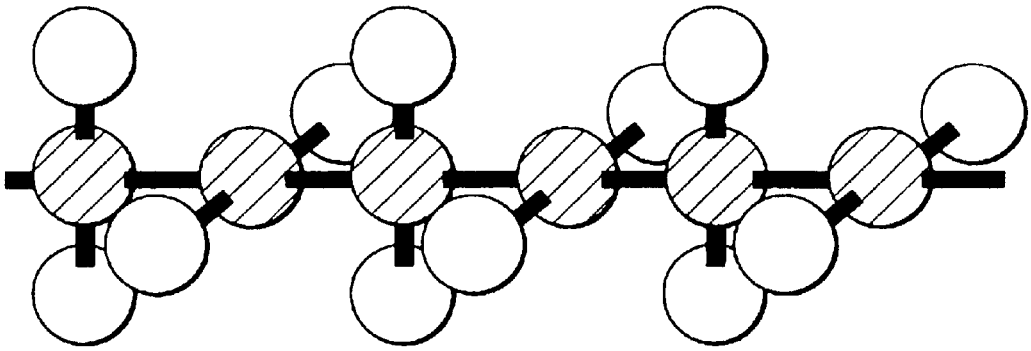
FIG. 6 is a diagram showing a configuration of a magnetic body according to the sixth embodiment of the present invention.

FIG. 6 shows a sixth embodiment of the magnetic body according to the present invention, which is formed by arranging first quantum dots (indicated by hatched circles) on first lattice points located on a first linear lattice, and arranging second quantum dots (indicated by blank circles) on second lattice points located at endpoints of a second linear lattice intersecting the first linear lattice perpendicularly in alternate directions, such that the electrons can transfer between the neighboring quantum dots.

In this case, one unit is formed by three dimensionally arranging one first quantum dot having four branches of directions into which the electrons can transfer, and two second quantum dots each having one branch of a direction into which the electrons can transfer. Then, these first and second quantum dots are three dimensionally connected in such a way that two branches of the first quantum dot are connected with one branch of one second quantum dot of the same unit and one branch of another second quantum dot of the same unit, while remaining two branches of the first quantum dot are connected with one branch of the first quantum dot of one neighbor unit and one branch of the first quantum dot of another neighbor unit.

The magnetic body of the sixth embodiment can have an overall structure in which a plurality of the above described units are linked periodically as shown in FIG. 6.

It is to be noted that the use of the three dimensional structure such as that of the fifth embodiment or the sixth embodiment is advantageous in that the magnitude of the ferromagnetism can be increased, and that the three dimensional arrangement of the quantum dots can be realized easier than the two dimensional arrangement of the quantum dots depending on the manufacturing technique used.

Figure 7:
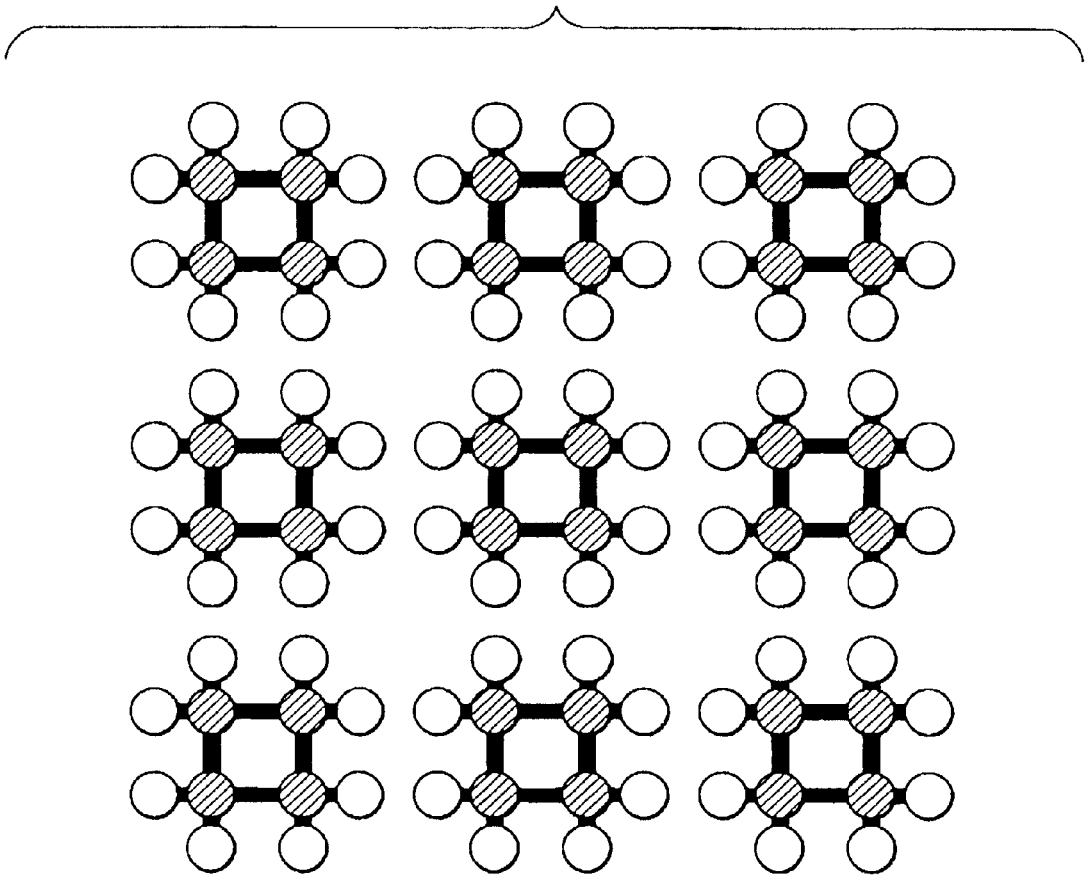
FIG. 7 is a diagram showing a configuration of a magnetic body according to the seventh embodiment of the present invention.

FIG. 7 shows a seventh embodiment of the magnetic body according to the present invention, which is formed by arranging first quantum dots (indicated by hatched circles) on first lattice points located at intersections of rectangular lattices, and arranging second quantum dots (indicated by blank circles) on second lattice points located at endpoints of the rectangular lattices, such that the electrons can transfer between the neighboring quantum dots, similarly as in the fourth embodiment.

In this case, a plurality of magnetic bodies each in a configuration of the fourth embodiment are two dimensionally arranged.

Figure 8:
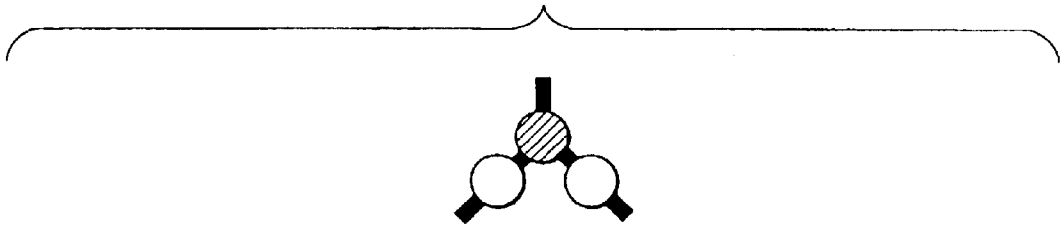
FIG. 8 is a diagram showing a configuration of a magnetic body according to the eighth embodiment of the present invention.
Figure 8:
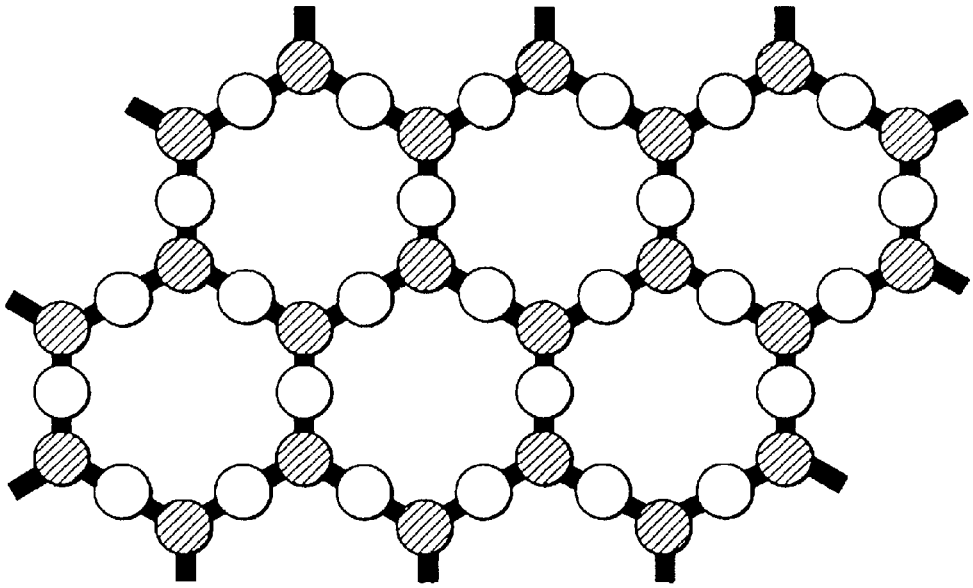

FIG. 8 shows an eighth embodiment of the magnetic body according to the present invention, which is formed by arranging first quantum dots (indicated by hatched circles) on first lattice points located at intersections of hexagonal (honeycomb) lattices, and arranging second quantum dots (indicated by blank circles) on second lattice points located at midpoints between the intersections of the hexagonal lattices, such that the electrons can transfer between the neighboring quantum dots.

In further detail, as shown in a part (a) of FIG. 8, one unit is formed by arranging one first quantum dot and two second quantum dots two dimensionally, such that one second quantum dot is arranged on a lower right side of the first quantum dot while another second quantum dot is arranged on a lower left side of the first quantum dot.

Namely, the first quantum dot has three branches of directions into which the electrons can transfer, and each of the second quantum dots has two branches of directions into which the electrons can transfer. Then, these first and second quantum dots are two dimensionally connected in such a way that two branches of the first quantum dot are connected with one branch of one second quantum dot of the same unit and one branch of another second quantum dot of the same unit, while a remaining one branch of the first quantum dot is connected with one branch of the second quantum dot of one neighbor unit, a remaining one branch of one second quantum dot is connected with one branch of the first quantum dot of another neighbor unit, and a remaining one branch of another second quantum dot is connected with one branch of the first quantum dot of still another neighbor unit.

The magnetic body of the eighth embodiment can have an overall structure in which a plurality of the above described units are linked periodically as shown in FIG. 8.

FIG. 9 shows a ninth embodiment of the magnetic body according to the present invention, which is formed by arranging three quantum dots $A_1$, $A_2$ and $A_3$ (indicated by blank circles) on lattice points located at intersections of triangular lattices in an overall shape of a reticulated double triangle pattern (Kagome), such that the electrons can transfer between the neighboring quantum dots $A_1$, $A_2$ and $A_3$.

In further detail, as shown in a part (a) of FIG. 9, one unit is formed by arranging three quantum dots two dimensionally, such that one quantum dot is arranged on a lower right side of a given quantum dot while another quantum dot is arranged on a lower left said of the given quantum dot.

Namely, each quantum dot has four branches of directions into which the electrons can transfer, and three such quantum dots are two dimensionally connected in such as way that two branches of each quantum dot $A_1$ ($A_2$,$A_3$) are connected with one branch of another quantum dot $A_2$ ($A_3$,$A_1$) of the same unit and one branch of still another quantum dot $A_3$ ($A_1$,$A_2$) of the same unit, while remaining two branch of the quantum dot is connected with one branch of the quantum dot of one neighbor unit and one branch of the quantum dot of another neighboring unit.

The magnetic body of the ninth embodiment can have an overall structure in which a plurality of the above described units are linked periodically as shown in FIG. 9.

In the magnetic bodies of the above embodiments, a bonding angle between the quantum dots may not necessarily be specific angles such as 90° and 180°, and arbitrary angle can be used as long the flat-band structure can be formed.

Also, a way of confining electrons inside the quantum dot can be arbitrary so that a box shaped (hard wall type) confining potential in which a dot is surrounded by vacuum or insulator or a parabolic confining potential using depletion layer can be used, for example. Also, a shape of a dot can be arbitrary.

In addition, a material constituting a dot can be any of III–V compound semiconductor such as GaAs, InAs, GaInAs, AlAs and GaAlAs, IV compound semiconductor such as Si and SiGe, and II–VI compound semiconductor such as CdTe.

As for a manufacturing method, it is possible to utilize the existing semiconductor manufacturing and growth techniques.

Figure 11:
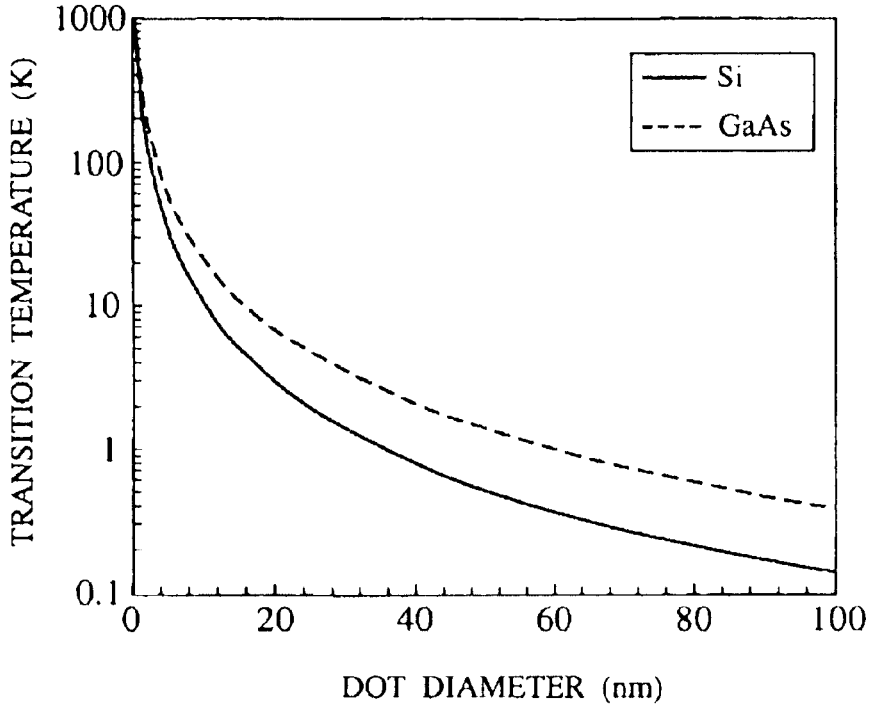
FIG. 11 is a graph showing a relationship between a critical temperature for exhibiting the ferromagnetism and a dot diameter for the reticulated double triangle pattern (Kagome) model of FIG. 9.

FIG. 11 shows a relationship between a critical (transition) temperature (in units of K) for exhibiting the ferromagnetism and a dot diameter (in units of nm), for a case of using Si dot array and a case of using GaAs dot array in the reticulated double triangle pattern (Kagome) model of FIG. 9, which is calculated by the exact diagonalization method on the Hubbard model. Here, the dot interval is assumed to be 1.5 times the dot diameter, but the result is similar for the dot interval in a range of 1.2 to 2.0 times the dot diameter. In practice, it is preferable to use the dot interval in a range of 1.0 to 2.0 times the dot diameter. Note that the relationship between the critical (transition) temperature and the dot diameter is similar to that shown in FIG. 11 even for the Lieb model and the polymer model.

As can be seen from FIG. 11, the ferromagnetism can be exhibited at temperatures above the room temperature (300K) for the dot diameter less than several nm. In practice, it is preferable to use the dot diameter not greater than 1 nm. Then, in practice, it is preferable to use the dot interval of 1 to 2 nm. The formation of the quantum dot in such a size is possible even by the present technology so that the realization of the ferromagnetism at the room temperature is quite feasible.

Figure 12:
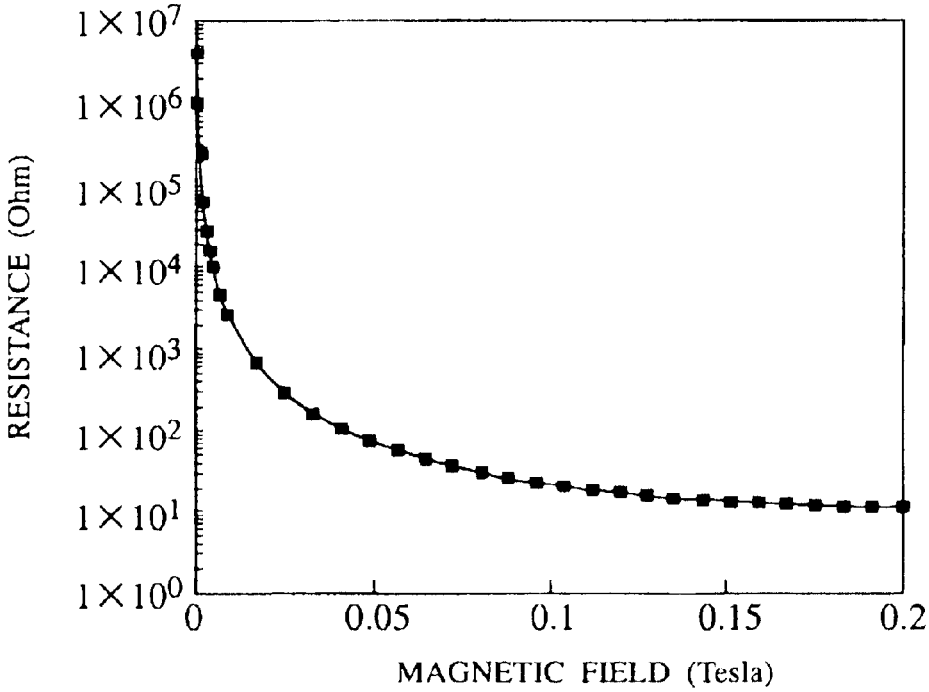
FIG. 12 is a graph showing a relationship between an exerted magnetic field and a planar electric resistance for the reticulated double triangle pattern (Kagome) model of FIG. 9.

In addition, the semiconductor magnetic body of the present invention is capable of generating a giant galvanomagnetic effect. As shown in FIG. 12, when an external magnetic field that is applied perpendicularly on the two dimensional dot array in the reticulated double triangle pattern (Kagome) model of FIG. 9 is increased, the planar electric resistance can be reduced significantly. This is due to the fact that the flat-band structure gradually acquires a dispersion because of the magnetic field penetration so that a transition from insulator to metal occurs.

This way of generating a giant galvanomagnetic effect using a flat-band magnetic body is a novel feature realizable by using the semiconductor magnetic body of the present invention, which is not known before. Namely, the galvanomagnetic effect is too small to be observable in the case of using graphite or atomic quantum wire having a small lattice interval such as several Å. In contrast, the galvanomagnetic effect generated by the semiconductor magnetic body of the present invention is a phenomenon specific to semiconductor that can be realized only by using the quantum dot array having a large lattice interval of several nm and a small electron effective mass. By utilizing such a giant galvanomagnetic effect, the semiconductor magnetic body of the present invention can be used in realizing a high sensitivity magnetic sensor or magnetic head using only semiconductor.

The semiconductor magnetic body of the present invention can be utilizing in a variety of applications by taking advantage of the fact that it is made of semiconductor.

For example, the semiconductor magnetic body of the present invention can be utilized as a magnet itself, as a magnetic memory medium or memory elements (of a horizontal type or a vertical type), and as magnetic sensors.

Here, the magnetic sensors may include an element (such as a magnetoresistance effect element or a Hall element) for converting an amplitude of the magnetic field into an amplitude of the electric current or vice versa by utilizing the galvanomagnetic effect, an element (such as a magnetic head or a motor) for converting a time change of the magnetic flux into an electromotive force or vice versa by utilizing the electromagnetic induction effect, and an element (such as a lead switch or a relay switch) for realizing a mechanical switching by utilizing the magnetic attraction/repulsion effect.

As described, the semiconductor magnetic body of the present invention is quite advantageous in that it can be produced by utilizing the existing semiconductor manufacturing and growth techniques, and that it can be produced on the same substrate as the other conventional devices such as transistors.

The use of the semiconductor magnetic body of the present invention can significantly contribute to the further down-sizing and the higher integration of LSI chips.

In addition, because of the use of semiconductor, the electron mobility and the dot shape can be changed easily in high precision, so that a highly controllable production of the semiconductor magnetic body can be realized. This fact can contribute to the improvement of quality and yield in the manufacturing process.

Also, the magnetic body can be produced by using only semiconductor materials such as silicon which are known to be harmless so that it is possible to eliminate any adverse effects on human bodies and environment and reduce the recycle cost by using the semiconductor magnetic body of the present invention.

It is also to be noted that, besides those already mentioned above, many modifications and variations of the above embodiments may be made without departing from the novel and advantageous features of the present invention. Accordingly, all such modifications and variations are intended to be included within the scope of the appended claims.

What is claimed is:

1. A semiconductor magnetic body, comprising:

semiconductor quantum dots arranged on lattice points such that electrons can transfer between neighboring quantum dots and the electron energy band contains a flat-band structure, where each quantum dot is a structure in which electrons are confined inside a region which is surrounded by high energy potential regions, and the flat-band structure is a band structure in which energy dispersion of electrons has hardly any wave number dependency.

2. The semiconductor magnetic body of claim 1, wherein the semiconductor quantum dots include:

first quantum dots arranged on first lattice points located at intersections of rectangular lattices; and second quantum dots arranged on second lattice points located at midpoints between intersections of the rectangular lattices.

3. The semiconductor magnetic body of claim 2, wherein the semiconductor quantum dots are arranged such that:

one unit is formed by arranging one first quantum dot and two second quantum dots two dimensionally in such a way that one second quantum dot is arranged on a right side of the first quantum dot while another second quantum dot is arranged on an upper side of the first quantum dot; and an overall structure is formed by linking a plurality of units periodically.

4. The semiconductor magnetic body of claim 3, wherein the first quantum dot has four branches of directions into which the electrons can transfer, and each of the second quantum dots has two branches of directions into which the electrons can transfer; and the first and second quantum dots are connected in such a way that upper and right branches of the first quantum dot of the one unit are connected with a left branch of the one second quantum dot of the one unit and a lower branch of the another second quantum dot of the one unit, lower and left branches of the first quantum dot of the one unit are connected with a right branch of the second quantum dot of a left neighbor unit and an upper branch of the second quantum dot of a lower neighbor unit, while a right branch of the one second quantum dot of the one unit is connected with a left branch of the first quantum dot of a right neighbor unit and an upper branch of the another second quantum dot of the one unit is connected with a lower branch of the first quantum dot of an upper neighbor unit.

5. The semiconductor magnetic body of claim 1, wherein the semiconductor quantum dots include:

first quantum dots arranged on first lattice points located on a first linear lattice; and second quantum dots arranged on second lattice points located at endpoints of a second linear lattice intersecting the first linear lattice perpendicularly.

6. The semiconductor magnetic body of claim 5, wherein the semiconductor quantum dots are arranged such that one unit is formed by arranging one first quantum dot and two second quantum dots two dimensionally, in such a way that one second quantum dot is arranged on an upper side of the first quantum dot while another second quantum dot is arranged on a lower side of the first quantum dot; and an overall structure is formed by linking a plurality of units periodically.

7. The semiconductor magnetic body of claim 6, wherein the first quantum dot has four branches of directions into which the electrons can transfer, and each of the second quantum dots has one branch of a direction into which the electrons can transfer; and the first and second quantum dots are connected in such a way that upper and lower branches of the first quantum dot of the one unit are connected with a lower branch of the one second quantum dot of the one unit and an upper branch of the another second quantum dot of the one unit, a left branch of the first quantum dot of the one unit is connected with a right branch of the first quantum dot of a left neighbor unit while a right branch of the first quantum dot of the one unit is connected with a left branch of the first quantum dot of a right neighbor unit.

8. The semiconductor magnetic body of claim 1, wherein the semiconductor quantum dots include:

first quantum dots arranged on first lattice points located at intersections of triangular or rectangular lattices; and second quantum dots arranged on second lattice points located at endpoints of the triangular or rectangular lattices.

9. The semiconductor magnetic body of claim 8, wherein the semiconductor quantum dots are arranged such that:

one unit is formed by two dimensionally arranging one first quantum dot having four branches of directions into which the electrons can transfer, and two second quantum dots each having one branch of a direction into which the electrons can transfer; and an overall structure is formed by linking a plurality of units are linked in a ring shape.

10. The semiconductor magnetic body of claim 9, wherein the first and second quantum dots are two dimensionally connected in such a way that two branches of the first quantum dot of the one unit are connected with one branch of one second quantum dot of the one unit and one branch of another second quantum dot of the one unit, while remaining two branches of the first quantum dot are connected with one branch of the first quantum dot of one neighbor unit and one branch of the first quantum dot of another neighbor unit.

11. The semiconductor magnetic body of claim 1, wherein the semiconductor quantum dots include:

first quantum dots arranged on first lattice points located at intersections of cubic lattices; and second quantum dots arranged on second lattice points located at midpoints between the intersections of the cubic lattices.

12. The semiconductor magnetic body of claim 11, wherein the semiconductor quantum dots are arranged such that:

one unit is formed by three dimensionally arranging one first quantum dot having six branches of directions into which the electrons can transfer, and three second quantum dots each having two branches of directions into which the electrons can transfer; and an overall structure is formed by linking a plurality of units periodically.

13. The semiconductor magnetic body of claim 12, wherein the first and second quantum dots are three dimensionally connected in such as way that three branches of the first quantum dot of the one unit are connected with one branch of one second quantum dot of the one unit, one branch of another second quantum dot of the one unit, and one branch of still another second quantum dot of the one unit, while remaining three branches of the first quantum dot of the one unit are connected with one branch of the second quantum dot of one neighbor unit, one branch of the second quantum dot of another neighbor unit, and one branch of the second quantum dot of still another neighbor unit.

14. The semiconductor magnetic body of claim 1, wherein the semiconductor quantum dots include:

first quantum dots arranged on first lattice points located on a first linear lattice; and second quantum dots arranged on second lattice points located at endpoints of a second linear lattice intersecting the first linear lattice perpendicularly in alternate directions.

15. The semiconductor magnetic body of claim 14, wherein the semiconductor quantum dots are arranged such that:

one unit is formed by three dimensionally arranging one first quantum dot having four branches of directions into which the electrons can transfer, and two second quantum dots each having one branch of a direction into which the electrons can transfer; and an overall structure is formed by linking a plurality of units periodically.

16. The semiconductor magnetic body of claim 15, wherein the first and second quantum dots are three dimensionally connected in such a way that two branches of the first quantum dot of the one unit are connected with one branch of one second quantum dot of the one unit and one branch of another second quantum dot of the one unit, while remaining two branches of the first quantum dot of the one unit are connected with one branch of the first quantum dot of one neighbor unit and one branch of the first quantum dot of another neighbor unit.

17. The semiconductor magnetic body of claim 1, wherein the semiconductor quantum dots include:

first quantum dots arranged on first lattice points located at intersections of hexagonal or honeycomb lattices; and second quantum dots arranged on second lattice points located at midpoints between the intersections of the hexagonal or honeycomb lattices.

18. The semiconductor magnetic body of claim 17, wherein the semiconductor quantum dots are arranged such that:

one unit is formed by arranging one first quantum dot and two second quantum dots two dimensionally, such that one second quantum dot is arranged on a lower right side of the first quantum dot while another second quantum dot is arranged on a lower left side of the first quantum dot; and an overall structure is formed by linking a plurality of units periodically.

19. The semiconductor magnetic body of claim 18, wherein the first quantum dot has three branches of directions into which the electrons can transfer, and each of the second quantum dots has two branches of directions into which the electrons can transfer; and the first and second quantum dots are two dimensionally connected in such a way that two branches of the first quantum dot of the one unit are connected with one branch of the one second quantum dot of the one unit and one branch of the another second quantum dot of the one unit, while a remaining one branch of the first quantum dot of the one unit is connected with one branch of the second quantum dot of one neighbor unit, a remaining one branch of the one second quantum dot of the one unit is connected with one branch of the first quantum dot of another neighbor unit, and a remaining one branch of the another second quantum dot of the one unit is connected with one branch of the first quantum dot of still another neighbor unit.

20. The semiconductor magnetic body of claim 1, wherein the semiconductor quantum dots include quantum dots arranged on lattice points located at intersections of triangular lattices in an overall shape of a reticulated double triangle pattern.

21. The semiconductor magnetic body of claim 20, wherein the semiconductor quantum dots are arranged such that:

one unit is formed by arranging three quantum dots two dimensionally, such that a first quantum dot is arranged on a lower right side of a second quantum dot while a third quantum dot is arranged on a lower left side of the second quantum dot; and an overall structure is formed by linking a plurality of units periodically.

22. The semiconductor magnetic body of claim 21, wherein each quantum dot has four branches of directions into which the electrons can transfer; and the quantum dots are two dimensionally connected in such a way that two branches of the first quantum dot of the one unit are connected with one branch of the second quantum dot of the one unit and one branch of the third quantum dot of the one unit, two branches of the second quantum dot of the one unit are connected with one branch of the third quantum dot of the one unit and one branch of the first quantum dot of the one unit, two branches of the third quantum dot of the one unit are connected with one branch of the first quantum dot of the one unit and one branch of the second quantum dot of the one unit, while remaining two branch of each quantum dot is connected with one branch of the quantum dot of one neighbor unit and one branch of the quantum dot of another neighboring unit.

23. The semiconductor magnetic body of claim 1, wherein each semiconductor quantum dot has a dot diameter not greater than 1 nm.

24. The semiconductor magnetic body of claim 1, wherein the semiconductor quantum dots are arranged at a dot interval in a range of 1 to 2 nm.

25. The semiconductor magnetic body of claim 1, wherein the semiconductor quantum dots generate an observable galvanomagnetic effect when an external magnetic field is applied thereon.

* * * * *